United States Patent
Butt et al.

(10) Patent No.: US 9,201,724 B2
(45) Date of Patent: Dec. 1, 2015

(54) END-TO END DATA PROTECTION SUPPORTING MULTIPLE CRC ALGORITHMS

(75) Inventors: Kevin D. Butt, Tucson, AZ (US); Paul J. Seger, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 652 days.

(21) Appl. No.: 13/459,417

(22) Filed: Apr. 30, 2012

(65) Prior Publication Data

US 2013/0055054 A1 Feb. 28, 2013

Related U.S. Application Data

(63) Continuation of application No. 13/215,445, filed on Aug. 23, 2011, now abandoned.

(51) Int. Cl.
*H03M 13/00* (2006.01)
*G06F 11/10* (2006.01)
*H03M 13/09* (2006.01)
*H03M 13/29* (2006.01)
*H03M 13/37* (2006.01)
*G11B 20/12* (2006.01)
*G11B 20/18* (2006.01)

(52) U.S. Cl.
CPC ........ *G06F 11/1004* (2013.01); *G11B 20/1201* (2013.01); *G11B 20/1833* (2013.01); *H03M 13/09* (2013.01); *H03M 13/2909* (2013.01); *H03M 13/3707* (2013.01); *H03M 13/6511* (2013.01); *H03M 13/6516* (2013.01); *G11B 2020/1843* (2013.01); *G11B 2220/90* (2013.01)

(58) Field of Classification Search
CPC ...................................................... H03M 13/09
USPC .................. 714/807, 759, 781, 751, 733, 701
See application file for complete search history.

(56) References Cited

U.S. PATENT DOCUMENTS

| | | | | |
|---|---|---|---|---|
| 4,929,946 | A | * | 5/1990 | O'Brien et al. ................. 341/87 |
| 5,247,638 | A | * | 9/1993 | O'Brien et al. ................. 710/68 |
| 6,189,124 | B1 | | 2/2001 | Glaise |
| 7,082,563 | B2 | | 7/2006 | Gemelli et al. |
| 7,103,824 | B2 | | 9/2006 | Halford |
| 2006/0090116 | A1 | | 4/2006 | Gallagher et al. |
| 2007/0038913 | A1 | | 2/2007 | Allen et al. |
| 2011/0040924 | A1 | | 2/2011 | Selinger |

OTHER PUBLICATIONS

SCSI Stream Commands-4 (SSC-4), American National Standards for Information Systems, Revision 01e, Jun. 22, 2011, available at www.t10.org.
Combined Search and Examination Report under Sections 17 and 18(3), Application No. GB1214800.3, Dec. 13, 2012.

* cited by examiner

*Primary Examiner* — Fritz Alphonse
(74) *Attorney, Agent, or Firm* — Nelson and Nelson; Daniel P. Nelson; Alexis V. Nelson

(57) ABSTRACT

A technique for providing end-to-end data protection while supporting multiple cyclic-redundancy-check (CRC) algorithms includes receiving a data block protected by a first CRC. The first CRC is generated using a first CRC algorithm. The integrity of the data block is checked using the first CRC and the first CRC algorithm. A second CRC for the data block is then computed using a second CRC algorithm different from the first CRC algorithm. The data block, first CRC, and second CRC are stored on a storage medium, such as magnetic tape.

25 Claims, 7 Drawing Sheets

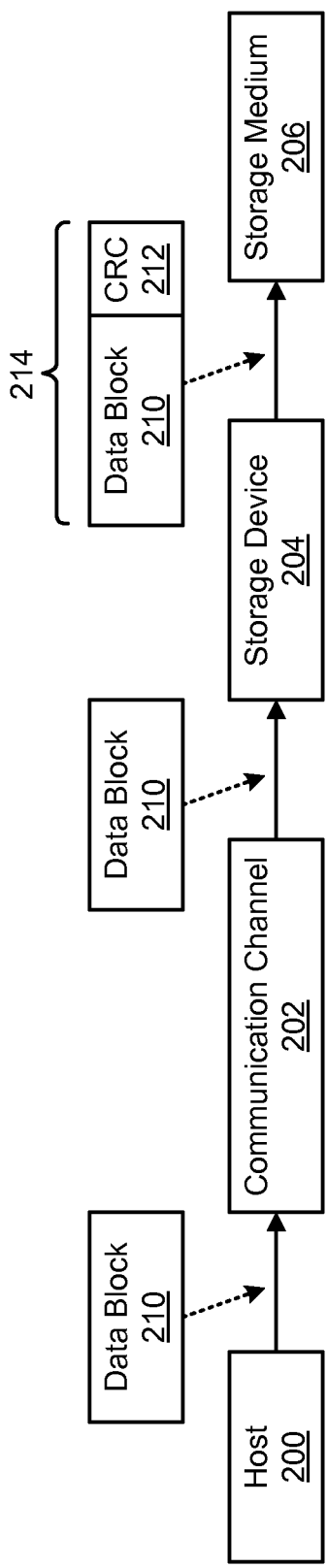
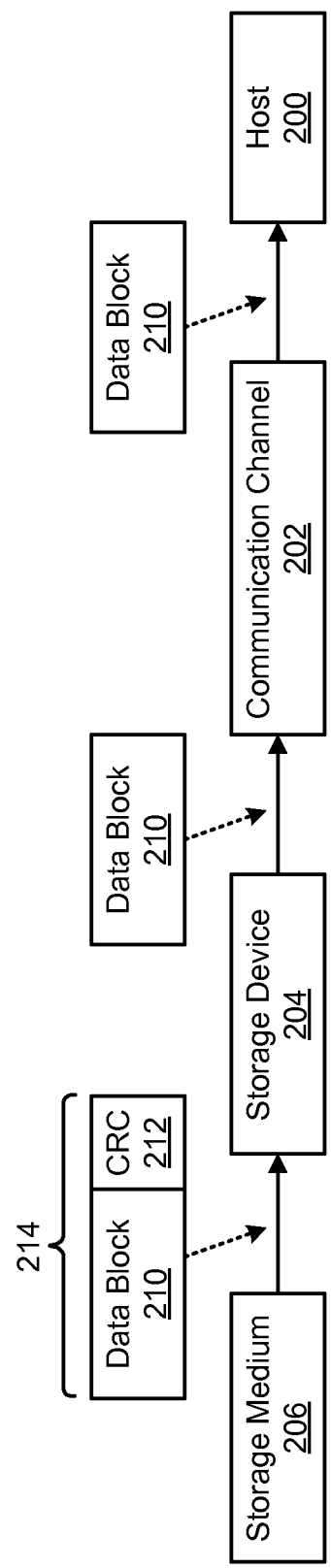
Fig. 2A
Fig. 2B

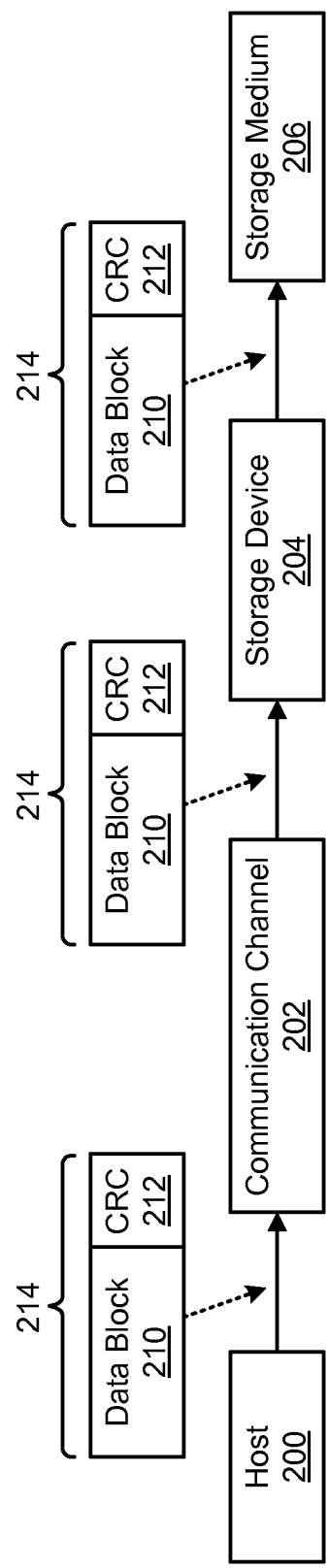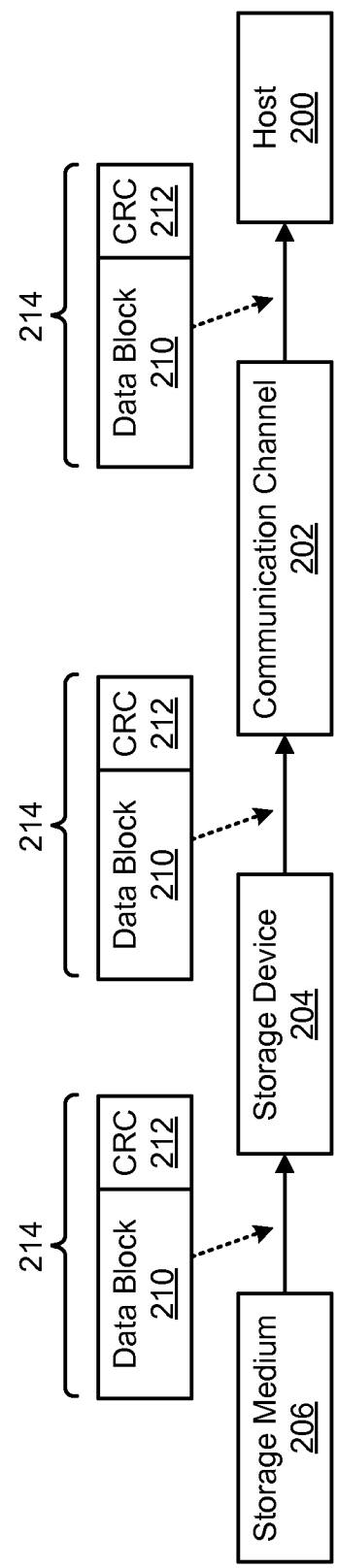
Fig. 3A
Fig. 3B

| Data Block 210 | CRC 212 |
|---|---|

| Data Block 210 | CRC 212 | ID 500 |
|---|---|---|

| Data Block 210 | CRC 1 212a | CRC 2 212b | ID 500 |

Fig. 8

END-TO END DATA PROTECTION SUPPORTING MULTIPLE CRC ALGORITHMS

BACKGROUND

1. Field of the Invention

This invention relates to data recording, and more particularly to apparatus and methods for providing end-to-end data protection while supporting multiple CRC algorithms.

2. Background of the Invention

End-to-end data protection is a feature that extends error detection to cover the entire path from a computer system (i.e., a host system) to a storage device (e.g., a hard drive) and back again to a computer system. This feature generally involves appending data protection information (e.g., CRCs) to data at the originating computer system. This data protection information then travels with the data from the computer system to the storage device along any intervening data path. Before writing the data to underlying storage media, the storage device may check the integrity of the data using the attached data protection information. If the integrity is good, the storage device may then write the data and data protection information to the storage media. When the same data is read from the storage media, the storage device may recheck the integrity of the data using the data protection information and, if the integrity is good, return the data and accompanying data protection information to the computer system.

Currently, the ANSI T10 standard defines a way to check the integrity of data travelling from a host device to a tape drive and back again through a data path such as a SAN fabric. The check is implemented through an appended CRC and is called logical block protection defined in the T10 standard. Nevertheless, the T10 standard does not take into account different algorithms (e.g., different CRC algorithms) that may be used to generate data protection information. For the data protection information to effectively protect the data, the same algorithm needs to be used by the various components (e.g., computer system, storage device, network components) along the data path. Current standards do not provide a way to effectively coordinate the use of multiple data protection algorithms.

In view of the foregoing, what are needed are apparatus and methods to provide end-to-end data protection on storage media such as magnetic tape. Ideally, such apparatus and methods will provide an additional marketing tool to convince users to adopt tape as a reliable, cost-effective data storage technology. Further needed are apparatus and methods to coordinate the use of multiple data protection (e.g., CRC) algorithms when providing end-to-end data protection.

SUMMARY

The invention has been developed in response to the present state of the art and, in particular, in response to the problems and needs in the art that have not yet been fully solved by currently available apparatus and methods. Accordingly, the invention has been developed to provide apparatus and methods for providing end-to-end data protection while supporting multiple data protection algorithms. The features and advantages of the invention will become more fully apparent from the following description and appended claims, or may be learned by practice of the invention as set forth hereinafter.

Consistent with the foregoing, a method for providing end-to-end data protection while supporting multiple cyclic-redundancy-check (CRC) algorithms is disclosed herein. In one embodiment, such a method includes receiving, from a first host device, a data block protected by a first CRC. The first CRC is generated using a first CRC algorithm. The method checks the integrity of the data block using the first CRC and the first CRC algorithm. The method then computes a second CRC for the data block using a second CRC algorithm different from the first CRC algorithm. The method then stores the data block, the first CRC, and the second CRC on a storage medium, such as magnetic tape.

A corresponding apparatus is also disclosed herein.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which:

FIGS. 2A and 2B show a data flow between a host device and a storage device that does not provide end-to-end data protection;

FIGS. 3A and 3B show a data flow between a host device and a storage device that provides end-to-end data protection;

FIG. 8 shows a fifth technique for providing end-to-end data protection while supporting multiple CRC algorithms.

DETAILED DESCRIPTION

Figure 1:
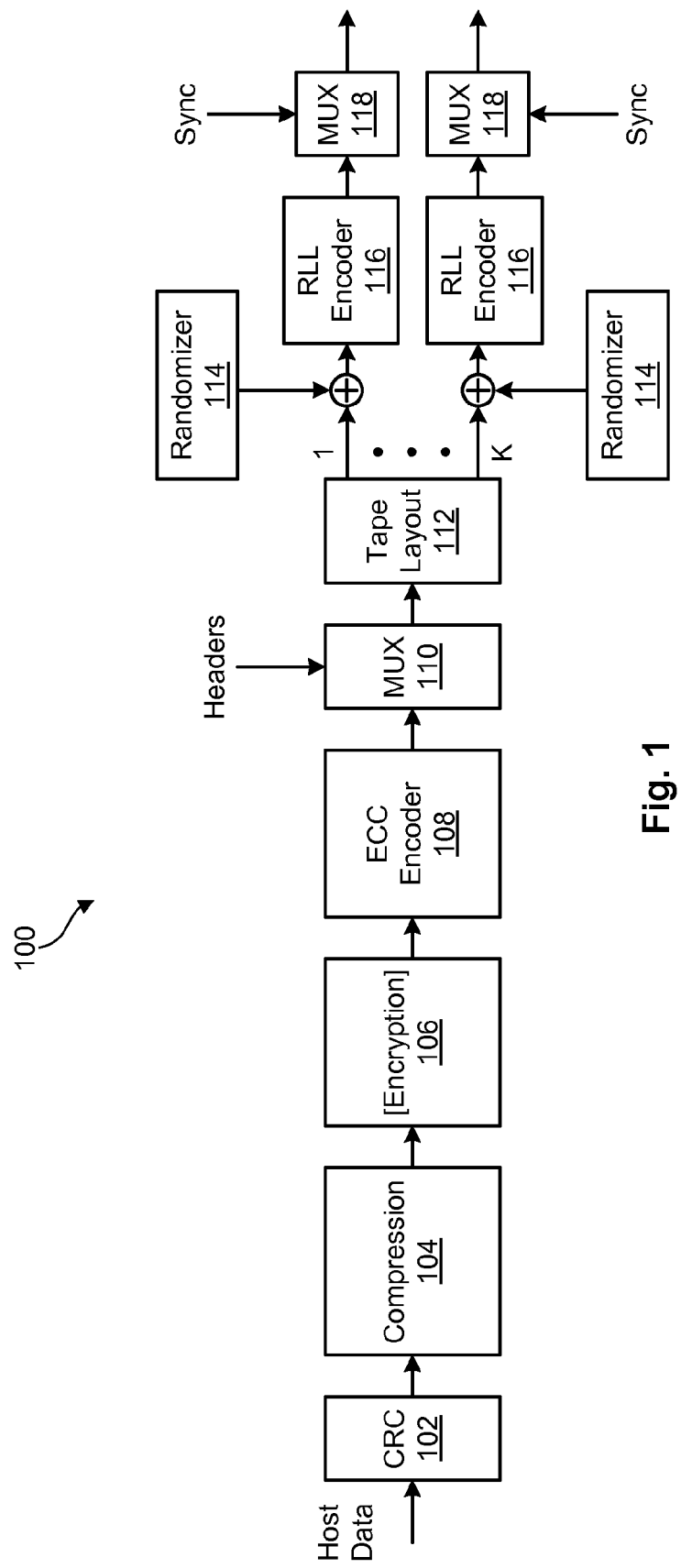
FIG. 1 is a high-level block diagram showing one example of a data flow for a tape drive.

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

As will be appreciated by one skilled in the art, the present invention may be embodied as an apparatus, system, method, or computer program product. Furthermore, the present invention may be implemented as a hardware embodiment, a software embodiment (including firmware, resident software, microcode, etc.) configured to operate hardware, or an embodiment combining both software and hardware elements. Each of these embodiments may be represented by one or more modules or blocks. Furthermore, the present invention may be implemented in a computer-usable storage medium embodied in any tangible medium of expression having computer-usable program code stored therein.

Any combination of one or more computer-usable or computer-readable storage medium(s) may be utilized to store the computer program product. The computer-usable or computer-readable storage medium may be, for example, but not limited to, an electronic, magnetic, optical, electromagnetic, infrared, or semiconductor system, apparatus, or device. More specific examples (a non-exhaustive list) of the computer-readable storage medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, or a magnetic storage device. In the context of this document, a computer-usable or computer-readable storage medium may be any medium that can contain, store, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like, and conventional procedural programming languages, such as the "C" programming language or similar programming languages. Computer program code for implementing the invention may also be written in a low-level programming language such as assembly language.

The present invention may be described below with reference to flowchart illustrations and/or block diagrams of methods, apparatus, systems, and computer program products according to embodiments of the invention. It will be understood that each block of the flowchart illustrations and/or block diagrams, and combinations of blocks in the flowchart illustrations and/or block diagrams, may be implemented by computer program instructions or code. The computer program instructions may be provided to a processor of a general-purpose computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be stored in a computer-readable storage medium that can direct a computer or other programmable data processing apparatus to function in a particular manner, such that the instructions stored in the computer-readable storage medium produce an article of manufacture including instruction means which implement the function/act specified in the flowchart and/or block diagram block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Referring to FIG. 1, a high-level block diagram showing an exemplary data flow 100 for a tape drive, such as an LTO or enterprise-level tape drive, is illustrated. As shown, a cyclic redundancy check (CRC) module 102 receives variable-length blocks of data (hereinafter referred to as "data blocks") from a host device. The CRC module 102 may add CRC information to these data blocks in order to protect the data therein. A compression module 104 may then compress the blocks and an encryption module 106 may optionally encrypt the blocks. The blocks of data may then be broken into sets of fixed size, which may in turn be broken into sub data sets (SDS) of fixed size. Each SDS may be organized into a two-dimensional array of data. Each SDS data array may then be passed to an ECC encoder 108. The ECC encoder 108 may generate ECC parity for each row in the data array and each column in the data array. This row ECC parity and column ECC parity may be appended to the array.

Once the ECC parity is appended to the array, a multiplexer 110 may add headers to the rows in the data array (including the column ECC parity and the row ECC parity). In certain embodiments, the headers contain data protection codes such as CRCs. A tape layout module 112 may distribute the extended data array, including the ECC parity and headers, across K different tracks and in different orders on the magnetic tape. The data sequences produced by the tape layout module 112 may be further processed with randomizers 114 to perform additional signal processing on the data. More specifically, the randomizers 114 may be used to transform the incoming data to create an output that is a pseudorandom sequence of "1"s and "0"s. This removes periodicity as much as possible from the incoming data. Run length limited (RLL) encoders 116 may process the randomized data streams to prevent unwanted patterns (e.g., long runs of "1"s or "0"s or other undesired patterns) from occurring in the data. Multiplexers 118 may multiplex synchronization information, such as variable frequency oscillator (VFO) patterns, sync characters, or the like, into the information to enable it to be synchronized when read.

The resulting data may then be sent to write drivers (not shown) which may cause current to flow through recording head elements to generate magnetic flux and thereby write the data to the tracks of the magnetic storage medium. In general, each of the blocks or modules to the right of the multiplexer 110 performs different transformations on the data to make it more suitable for magnetic recording.

Referring to FIGS. 2A and 2B, adding a cyclic redundancy check (CRC) error detecting code to a data stream is a well known means of protecting a data unit in order to determine whether errors have occurred. FIGS. 2A and 2B show one example of a data flow between a host device 200 and a storage device 204 that uses CRCs to protect data on storage media 206 but does not provide end-to-end data protection. As shown in FIG. 2A, an external source 200 such as a host device 200 sends blocks 210 of data to a storage device 204, such as a storage device 204 storing data on magnetic tape. The data block 210 may travel through a communication channel 202 which may include, for example, a SAN fabric or other network components. Upon arriving at the storage device 204, the storage device 204 computes a CRC 212 over the data block 210 and appends the CRC 212 to the data block 210, thereby generating a codeword 214. The codeword 214, comprising both the data 210 and the CRC 212, is written to the storage medium 206.

As shown in FIG. 2B, when a host device 200 requests the data 210 from the storage device 204, the storage device 204 reads the codeword 214 and checks the validity of the data 210 using the CRC 212. If the data 210 is valid, the storage device 204 returns the data 210 to the host device 200 through the communication channel 202. If the data 210 is invalid, the storage device 204 returns an error indication to the host device 200. In this manner, the storage device 204 assures the integrity of data 210 that is received from a host 200 and returned to a host 200 (either the same or a different host 200) within the storage device data path.

Referring to FIGS. 3A and 3B, more recently, there has been a desire to protect a data block 210 not only within a storage device 204, but also through the entire data path from a host device 200, through various communication layers 202, to a storage device 204, and back again through the communication layers 202 to the same or a different host 200. As previously mentioned, this is commonly referred as end-to-end data protection. Such end-to-end data protection may be achieved if an originator of data 210 (e.g., a host device 200) computes and appends a CRC 212 to the data 210, thereby forming a codeword 214, before the data 210 is transmitted through the system. Each element in the system retains the CRC 212 and returns the same CRC 212 to the host 200 (the same or a different host 200) when the data 210 is retrieved. Upon verifying the integrity of the data 210 using the CRC 212, the host 200 is assured that the data 210 retrieved is the same data 210 that was originally stored.

When the CRC computation and check is performed inside the storage device 204, only the storage device 204 needs to know which algorithm is used to compute the CRC 212—i.e., the CRC 212 does not exist outside the storage device 204. This is not the case with end-to-end data protection. When only a single CRC algorithm is used, there is no need to manage information about the algorithm among the several system components 200, 202, 204. However, when more than one CRC algorithm is used, mechanisms are needed to coordinate or otherwise assure that each system element knows which CRC algorithm is being used. The following description and associated Figures will describe various techniques for managing the use of multiple CRC algorithms.

Figures 4, 5:
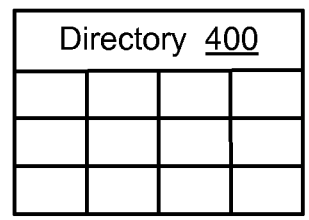
FIG. 4 shows a first technique for providing end-to-end data protection while supporting multiple CRC algorithms.
FIG. 5 shows a second technique for providing end-to-end data protection while supporting multiple CRC algorithms.

Referring to FIG. 4, a first technique for providing end-to-end data protection while supporting multiple CRC algorithms is illustrated. This technique is referred to herein as a "mode page only" technique. Using such a technique, a host device 200 specifies which CRC algorithm the host device 200 is using. The host device 200 may accomplish this by sending a mode page command, indicating which CRC algorithm the host device 200 is using, to the storage device 204 prior to transferring data 210 to the storage device 204. The host codeword CRC 212 may be generated with this algorithm. Upon receiving the codeword 214, the storage device 204 checks the codeword CRC 212 by computing its own CRC over the data portion 210 of the codeword 214 using the specified algorithm. If the CRC 212 checks, the host codeword 214 is written to the storage medium 206.

To retrieve data 210 from the storage device 204, the host device 200 (which may be the same or a different host device 200) specifies the CRC algorithm again by setting a mode page. When the storage device 204 retrieves the codeword 214 from the storage medium 206, the storage device 204 computes the CRC 212 over the data portion 210, checks the validity of the CRC 212, and, if valid, transfers the entire codeword 214 to the host 200. If the CRC 212 is not valid, the storage device 204 sends an error indication to the host 200.

Although effective, the "mode page only" technique described above requires that the reading host 200 know which CRC 212 algorithm was used to protect the data 210 when it was stored. To accomplish this, a directory 400 may be maintained at some location to indicate which CRC algorithm is associated with each data block 210 on the storage medium 206. Such a directory 400, if maintained on a block-by-block basis, is likely to be very large. That is, a modern storage medium 206 may store many hundreds of millions of individual data blocks 210. Furthermore, the directory 400 needs to remain consistent across all hosts 200 or devices that access data 210 on the storage medium 206. This technique also requires that the retrieving system 200 support the CRC algorithm that was used to originally record the data 210 on the storage medium 206.

Referring to FIG. 5, a second technique for providing end-to-end data protection while supporting multiple CRC algorithms is illustrated. This technique differs from the "mode page only" technique described above in that it records a CRC algorithm identifier 500 with each codeword 214. Using this technique, the host device 200 may, like the previous example, specify the CRC algorithm that the host 200 is using to generate the CRC 212 using a mode page command or other mechanism. The host 200 may then transfer codewords 214 to and from the storage medium 206 in the manner previously described. However, unlike the "mode page only" technique, the storage device 204 adds a CRC algorithm identifier 500 to the codeword 214 that indicates the CRC 212 algorithm that was used by the originating host 200 to generate the CRC 212. The CRC algorithm identifier 500 may precede the data 210, be recorded between the data 210 and the CRC 212, follow the CRC 212, or the like.

When data 210 is retrieved from the storage device 204, the storage device 204 reads the CRC algorithm identifier 500 and checks the integrity of the data 210 using the CRC algorithm identified in the algorithm field. In certain embodiments, a host 200 may query the storage device 204 to learn which CRC algorithm was used when the codeword 214 was written to the storage medium 206. In certain embodiments, this query is performed for each requested codeword. Alternatively, the host 200 may assume that the CRC algorithm for each codeword 214 is the same as the CRC algorithm that was used with the first checked codeword 214. If a codeword 214 is read that was recorded with a CRC algorithm that is different than the assumed CRC algorithm, an error may occur in the host 200 and the host 200 may invoke recovery procedures to determine which CRC algorithm, if any, was used when the codeword 214 was written to the storage medium 206.

The technique described in association with FIG. 5 eliminates the need to maintain a block/CRC algorithm directory 400, but requires adding a CRC algorithm identifier 500 to the codeword 214. This technique also requires that all system elements (i.e., host devices 200, communication layer components 202, storage devices 204, etc.) that receive and process the retrieved codeword 214 support the CRC algorithm that was used to protect the data 210. It is also worth noting that the CRC algorithm identifier 500 is essential to validating the CRC when reading the data 210 but the CRC algorithm identifier 500 is not protected in any way.

Figure 6A:
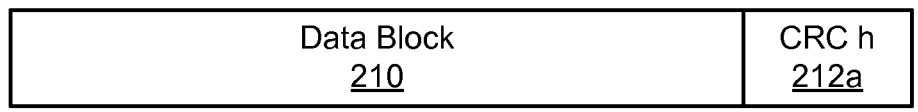
FIGS. 6A through 6C show a third technique for providing end-to-end data protection while supporting multiple CRC algorithms.
Figure 6B:
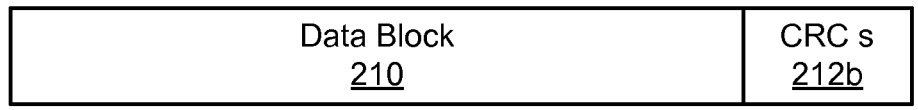
Figure 6C:
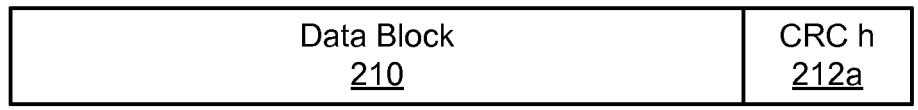

Referring to FIGS. 6A through 6C, another technique for providing end-to-end data protection while supporting multiple CRC algorithms is illustrated. Using this technique, a storage device 204 returns the CRC 212 whose CRC algorithm is specified by the host 200 retrieving the data 210. The storage device 204 uses its own internal CRC algorithm to generate CRCs 212 for use with stored data 210 if the CRC algorithm specified by the host 200 is different from the storage device's own internal CRC algorithm. When storing data 210, the writing host 200 specifies the CRC algorithm that was used to generate the CRC 212 for the codeword 214. This CRC 212 is labeled "CRC h," as indicated in FIG. 6A. Upon receiving the codeword 214, the storage device 204 checks the host codeword CRC 212 using the host-specified CRC algorithm. The storage device 204 then generates a CRC 212 using its own internal CRC algorithm if the host-specified algorithm is different than the storage device's own internal algorithm, and replaces the host CRC 212 with the newly generated CRC 212 (i.e., "CRC s"), as shown in FIG. 6B.

When data 210 is retrieved from the storage device 204, the retrieving host 200 specifies the CRC algorithm that it wants in the retrieved data 210, using a mechanism such as a mode page command. The storage device 204 then retrieves the requested data 210 from the storage medium 206, checks the validity of the data 210 using the stored CRC 212 (i.e., "CRC s"), and, if the data 210 is good and the host-selected algorithm is different from the storage device's internal algorithm, computes a CRC 212 (i.e., "CRC h") using the CRC algorithm specified by the host 200. As shown in FIG. 6C, the storage device 204 then replaces its CRC 212 (i.e., "CRC s") with the newly generated CRC 212 (i.e., "CRC h") if the host-selected algorithm is different than the storage device's internal algorithm before sending the codeword 214 to the host 200.

The technique described in association with FIGS. 6A through 6C has advantages in that it does not require a host directory 400 relating data blocks 210 with associated CRC algorithms. It also does not require CRC algorithm identifiers 500 to be used with the codewords 214—i.e., the host 200 retrieving data 210 may specify the CRC algorithm it wants without regard to the CRC algorithm that was used by the source host 200 or the storage device 204 that stored the data 210. On the other hand, the technique does not retain the original host CRC 212, thereby not providing true end-to-end data protection in which the original CRC 212 is maintained through the entire storage and retrieval data path. When the storage device 204 generates its internal CRC 212 to replace the host CRC 212 when storing data 210, or the storage device 204 replaces its internal CRC 212 with the host-specified CRC 212 when retrieving data 210, the data 210 is not inherently protected.

Referring to FIGS. 7A through 7D, another technique for providing end-to-end data protection while supporting multiple CRC algorithms is illustrated. This technique retains the host CRC 212, does not require a directory 400, and allows a retrieving host 200 to specify one of several CRC algorithms for the retrieved codeword 214. Where multiple CRC algorithms are used in the storage environment, the number of CRC algorithms will likely be small, with two being the most likely number. The illustrated example provides support for two CRC algorithms (i.e., "CRC algorithm 1" and "CRC algorithm 2"), although the disclosed technique may be readily expanded to support more than two CRC algorithms.

Figure 7A:
FIGS. 7A through 7D show a fourth technique for providing end-to-end data protection while supporting multiple CRC algorithms.
Figure 7B:

When storing data 210 on a storage device 204, the host 200 specifies the CRC algorithm that it used to generate the CRC 212a (i.e., "CRC 1") using a mechanism such as a mode page command. The host 200 then sends a codeword 214, as shown in FIG. 7A, to the storage device 204. The storage device 204 validates the data 210 in the codeword 214 as it is received using the specified CRC algorithm, in this example CRC algorithm 1. The storage device 204 simultaneously computes the CRC 212b (i.e., "CRC 2") using CRC algorithm 2. The storage device 204 then records the data 210, the first CRC 212a (i.e., "CRC 1"), and the second CRC 212b (i.e., "CRC 2") on the storage medium 206, as shown in FIG. 7B. The CRCs 212a, 212b are recorded in a consistent order—i.e., CRC 2 always follows CRC 1 or vice versa.

Alternatively, if the host 200 specifies that it is using CRC algorithm 2, the storage device 204 checks the data 210 as it is received using CRC algorithm 2. The storage device 204 simultaneously computes the CRC 212a using CRC algorithm 1. The storage device 204 then records the data 210, the first CRC 212a (i.e., "CRC 1"), and the second CRC 212b (i.e., "CRC 2") on the storage medium 206, as shown in FIG. 7B. In both cases, the CRCs 212a, 212b for the CRC algorithms are recorded in the same order on the storage medium 206.

Figure 7C:
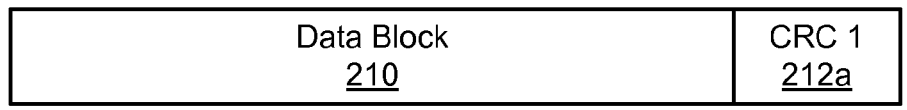

When retrieving data 210, the host 200 specifies the CRC algorithm for the CRC 212 that it wants in the retrieved codewords 214 using, for example, a mode page command. Assume for the sake of example that the host 200 specifies CRC algorithm 1. In such a case, the storage device 204 checks the data 210 as it is retrieved using CRC algorithm 1, checking the data 210 against the corresponding CRC 212a (i.e., CRC 1) in the retrieved data 210. The storage device 204 then returns the data 210 and the first CRC 212a to the requesting host 200, as shown in FIG. 7C. Optionally, for additional security, the storage device 204 simultaneously computes the CRC 212b associated with CRC algorithm 2, checking against the corresponding CRC field in the retrieved data 210.

Figure 7D:

If, on the other hand, the host 200 specifies CRC algorithm 2, the storage device checks the data 210 as it is retrieved from the storage medium 206 using CRC algorithm 2, checking against the corresponding CRC 212b (i.e., CRC 2) in the retrieved data 210. The storage device 204 then returns the data 210 and the second CRC 212b to the requesting host 200, as shown in FIG. 7D. Optionally, for additional security, the storage device 204 simultaneously computes the CRC 212a associated with CRC algorithm 1, checking against the corresponding CRC field in the retrieved data 210.

In this manner, if the host 200 that retrieves the data 210 sets the mode page to the same CRC algorithm as the host 200 that stored the data 210, the storage device 204 returns a CRC 212 to the retrieving host 200 that is identical to the CRC 212 created by the storing host 200. This achieves true end-to-end data protection. If, on the other hand, the host 200 that retrieves the data 210 sets the mode page to a different CRC algorithm than the host 200 that stored the data 210, the storage device 204 will return a CRC 212 that is different than the CRC 212 created by the storing host 200.

The overhead of the technique described in association with FIGS. 7A through 7D is small. It requires an additional CRC field, typically 4 bytes, to be stored with the data block 210 for each additional CRC algorithm that is supported. Advantages of this technique may include the following: (1) no directory 400 is required to store the CRC algorithm that is associated with each data block 210; (2) a host 200 may use any of the agreed upon CRC algorithms when storing data 210; (3) a host 200 may use any of the agreed upon CRC algorithms when retrieving data 210; (4) no CRC algorithm coordination is required between the storing and retrieving hosts 200; and (5) a true end-to-end single CRC 212 is achieved if the storing and retrieving hosts 200 use the same CRC algorithm, regardless of which CRC algorithm the hosts 200 use.

Figure 8:
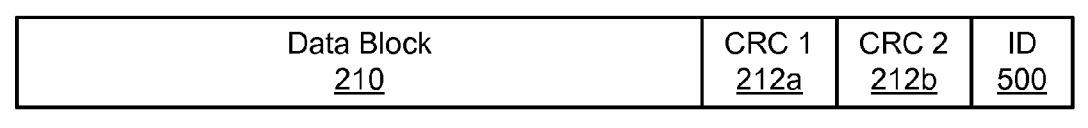

Referring to FIG. 8, another technique for providing end-to-end data protection while supporting multiple CRC algorithms is illustrated. This technique is a variation of the technique illustrated in FIGS. 7A through 7D. In this embodiment, all supported CRCs and a CRC algorithm identifier 500 may be appended to the data 210 and written to the storage medium 206. That is, a CRC 212 generated by a writing host 200 is appended to the data 210, along with storage-device-generated CRCs 212 for all other supported CRC algorithms and a CRC algorithm identifier 500 indicating which CRC algorithm was used by the writing host 200 to generate the CRC 212. In the illustrated example, two CRC algorithms are supported, although this technique could be extended to include additional CRC algorithms.

In certain embodiments, a reading host 200 may query the storage device 204 to retrieve the CRC algorithm identifier 500, thereby allowing the reading host 200 to determine which CRC algorithm was used by the writing host 200. If the reading host 200 chooses the CRC algorithm used by the writing host 200, then the storage device 204 may return the original CRC 212, thereby achieving true end-to-end data protection. If, on the other hand, the reading host 200 chooses a different CRC algorithm, then the storage device 204 may return the requested CRC 212 and use the original CRC 212 to double-check the integrity of the data 210. In certain embodiments, the CRC algorithm identifier 500 is protected by all or some of the supported CRCs 212 (except the original CRC 212, which protects the data 210 only) by including the CRC algorithm identifier 500 in the CRC calculation.

When data 210 is retrieved from the storage device 204, the storage device 204 may verify the integrity of the data 210 and the CRC algorithm identifier 500 using all or some of the supported CRCs 212, except the original CRC 212. The original CRC 212 may be used to validate the data 210 only. If a host 200 requests the original CRC 212, the storage device 204 may return the data 210 with the original CRC 212. If, on the other hand, a host 200 requests a different CRC 212, the CRC 212 may be regenerated over the data 210 only (without taking into account the CRC algorithm identifier 500) and returned to the host 200 with the data 210.

The techniques described in FIGS. 4 through 8 have been described primarily as they relate to protecting data stored on magnetic tape. However, it is contemplated that the disclosed techniques may also be used with other types of storage media. Thus, the disclosed techniques are presented only by way of example and not limitation. All or part of the disclosed techniques may be used with other known techniques for protecting data, or features of certain disclosed techniques may be used in all or in part with features of other disclosed techniques. Thus, variations of the disclosed techniques are possible and within the scope of the invention.

The flowcharts and/or block diagrams in the Figures illustrate the architecture, functionality, and operation of possible implementations of systems, methods, and computer-usable storage media according to various embodiments of the present invention. In this regard, each block in the flowcharts and/or block diagrams may represent a module, segment, or portion of code, which comprises one or more executable instructions for implementing the specified logical function(s). It should also be noted that, in some alternative implementations, the functions noted in a block may occur in a different order than that illustrated in the Figures. For example, two blocks shown in succession may, in fact, be implemented in the reverse order, depending upon the functionality involved. It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

The invention claimed is:

1. A method for providing end-to-end data protection while supporting multiple cyclic-redundancy-check (CRC) algorithms, the method comprising:
    receiving, by a storage device from a first host device, a data block protected by a first CRC, the first CRC generated by a first CRC algorithm;
    checking, by the storage device, the integrity of the data block using the first CRC and the first CRC algorithm;
    computing, by the storage device, a second CRC for the data block using a second CRC algorithm different from the first CRC algorithm; and
    storing, by the storage device, the data block, the first CRC, and the second CRC on a storage medium.

2. The method of claim 1, further comprising receiving, by the storage device, an indication from the first host device that the first CRC was generated using the first CRC algorithm.

3. The method of claim 1, further comprising requesting, by a second host device, the data block on the storage medium.

4. The method of claim 3, further comprising specifying, by the second host device, which of the first and second CRC algorithms the second host device is using.

5. The method of claim 4, further comprising:
    if the second host device is using the first CRC algorithm, checking, by the storage device, the integrity of the data block using the first CRC; and
    if the second host device is using the second CRC algorithm, checking, by the storage device, the integrity of the data block using the second CRC.

6. The method of claim 5, further comprising:
    if the second host device is using the first CRC algorithm, additionally checking, by the storage device, the integrity of the data block using the second CRC; and
    if the second host device is using the second CRC algorithm, additionally checking, by the storage device, the integrity of the data block using the first CRC.

7. The method of claim 4, further comprising:
    if the second host device is using the first CRC algorithm, returning, by the storage device, the first CRC with the data block to the second host device; and
    if the second host device is using the second CRC algorithm, returning, by the storage device, the second CRC with the data block to the second host device.

8. The method of claim 1, further comprising storing, by the storage device, a CRC algorithm identifier with the data block identifying the CRC algorithm the first host device is using.

9. The method of claim 8, wherein computing the second CRC comprises computing the second CRC to protect both the data block and the CRC algorithm identifier together.

10. The method of claim 9, further comprising, in the event a second host device requests the data block with the second CRC, recomputing, by the storage device, the second CRC to protect the data block only, and returning the data block and the recomputed second CRC to the second host device.

11. The method of claim 1, wherein the first and second CRCs are stored on the storage medium in a consistent order.

12. The method of claim 1, wherein the storage medium is magnetic tape.

13. An apparatus for providing end-to-end data protection while supporting multiple cyclic-redundancy-check (CRC) algorithms, the apparatus comprising:
    a storage device to receive, from a first host device, a data block protected by a first CRC, the first CRC generated by a first CRC algorithm;
    the storage device further configured to check the integrity of the data block using the first CRC and the first CRC algorithm;
    the storage device further configured to compute a second CRC for the data block using a second CRC algorithm different from the first CRC algorithm; and
    the storage device further configured to store the data block, the first CRC, and the second CRC on a storage medium.

14. The apparatus of claim 13, wherein the storage device is further configured to receive an indication from the first host device that the first CRC was generated using the first CRC algorithm.

15. The apparatus of claim 13, wherein the storage device is further configured to receive, from a second host device, a request for the data block on the magnetic tape medium.

16. The apparatus of claim 15, wherein the storage device is further configured to receive, from the second host device, an indication of which of the first and second CRC algorithms the second host device is using.

17. The apparatus of claim 16, wherein the storage device is further configured to:
   check the integrity of the data block using the first CRC if the second host device is using the first CRC algorithm; and
   check the integrity of the data block using the second CRC if the second host device is using the second CRC algorithm.

18. The apparatus of claim 17, wherein the storage device is further configured to:
   additionally check the integrity of the data block using the second CRC if the second host device is using the first CRC algorithm; and
   additionally check the integrity of the data block using the first CRC if the second host device is using the second CRC algorithm.

19. The apparatus of claim 16, wherein the storage device is further configured to:
   return, to the second host device, the first CRC with the data block if the second host device is using the first CRC algorithm; and
   return, to the second host device, the second CRC with the data block if the second host device is using the second CRC algorithm.

20. The apparatus of claim 13, wherein the storage device is further configured to store a CRC algorithm identifier with the data block identifying the CRC algorithm the first host device is using.

21. The apparatus of claim 20, wherein the storage device is further configured to compute the second CRC to protect both the data block and the CRC algorithm identifier together.

22. The apparatus of claim 21, wherein the storage device is further configured to, in the event a second host device requests the data block with the second CRC, recompute the second CRC to protect the data block only, and return the data block and the recomputed second CRC to the second host device.

23. The apparatus of claim 13, wherein the first and second CRCs are stored on the storage medium in a consistent order.

24. The apparatus of claim 13, wherein the storage device is a tape drive.

25. The apparatus of claim 13, wherein the storage medium is magnetic tape.

* * * * *